United States Patent
Mirowski et al.

(10) Patent No.: US 10,809,331 B2
(45) Date of Patent: Oct. 20, 2020

(54) LIQUID CRYSTAL THERMOMETER FOR MRI

(71) Applicants: QALIBRE MD, INC., Boulder, CO (US); NATIONAL INSTITUTE OF STANDARDS AND TECHNOLOGY, Gaithersburg, MD (US)

(72) Inventors: Elizabeth Mirowski, Nederland, CO (US); Michael Snow, Erie, CO (US); Kathryn Keenan, Boulder, CO (US)

(73) Assignee: QalibreMD, Boulder, CO (US)

( * ) Notice: Subject to any disclaimer, the term of this patent is extended or adjusted under 35 U.S.C. 154(b) by 102 days.

(21) Appl. No.: 15/912,420

(22) Filed: Mar. 5, 2018

(65) Prior Publication Data

US 2019/0271750 A1 Sep. 5, 2019

(51) Int. Cl.
  *G01R 33/48* (2006.01)
  *G01K 15/00* (2006.01)
  *G01R 33/56* (2006.01)
  *G01R 33/28* (2006.01)
  *G01N 24/08* (2006.01)

(52) U.S. Cl.
  CPC ....... *G01R 33/4804* (2013.01); *G01K 15/005* (2013.01); *G01N 24/08* (2013.01); *G01R 33/28* (2013.01); *G01R 33/5601* (2013.01)

(58) Field of Classification Search
  CPC ................ G01R 33/4804; G01R 33/28; G01R 33/5601; G01K 15/005; G01N 24/08
  See application file for complete search history.

(56) References Cited

U.S. PATENT DOCUMENTS

| | | | | |
|---|---|---|---|---|
| 4,859,360 A | * | 8/1989 | Suzuki | G01K 11/165 252/299.7 |
| 5,810,888 A | * | 9/1998 | Fenn | A61K 41/0028 600/407 |
| 6,280,384 B1 | * | 8/2001 | Loeffler | G01K 7/38 374/E7.04 |
| 8,335,554 B2 | * | 12/2012 | Pananakis | A61N 1/403 600/411 |
| 9,852,705 B2 | * | 12/2017 | Kim | G09G 3/3614 |
| 2004/0064031 A1 | * | 4/2004 | Dean | G01R 33/3804 600/410 |
| 2005/0136002 A1 | * | 6/2005 | Fossheim | A61B 5/01 424/1.11 |
| 2007/0197904 A1 | * | 8/2007 | Viglianti | A61B 5/055 600/420 |

(Continued)

FOREIGN PATENT DOCUMENTS

CA 1288812 9/1991

*Primary Examiner* — Nathaniel T Woodward
*Assistant Examiner* — Philip L Cotey

(57) ABSTRACT

Provided herein are novel liquid crystal based devices for the facile measurement of temperature in an MRI system. The thermometers comprise a plurality of vessels wherein each vessel contains a liquid crystal composition having a unique phase transition temperature. By scanning with appropriate techniques, the state of the liquid crystals in each vessel can be assessed, and the temperature at the time of the scan can be determined by the state of the liquid crystal compositions. Also provided are novel vessels and assemblies of vessels that can be used as MRI thermometers and which are compatible with MRI phantoms.

17 Claims, 2 Drawing Sheets

(56) References Cited

U.S. PATENT DOCUMENTS

| | | | | |
|---|---|---|---|---|
| 2009/0191131 A1* | 7/2009 | Fossheim | ............... | A61B 5/01 |
| | | | | 424/9.321 |
| 2009/0192383 A1* | 7/2009 | Pananakis | .......... | G01R 33/4804 |
| | | | | 600/411 |
| 2014/0005523 A1* | 1/2014 | Kohler | ................. | A61B 5/055 |
| | | | | 600/411 |
| 2015/0247908 A1* | 9/2015 | Liu | ................. | G01R 33/4804 |
| | | | | 324/309 |
| 2015/0273245 A1* | 10/2015 | Nurmilaukas | .......... | A61N 7/02 |
| | | | | 601/3 |
| 2016/0133204 A1* | 5/2016 | Kim | ................. | G09G 3/3614 |
| | | | | 345/101 |

\* cited by examiner

LIQUID CRYSTAL THERMOMETER FOR MRI

STATEMENT REGARDING FEDERALLY SPONSORED RESEARCH OR DEVELOPMENT

This invention was made with government support under grant numbers 70NANB14H297 awarded by the National Institute of Standards and Technology. The government has certain rights in the invention.

BACKGROUND OF THE INVENTION

Magnetic resonance imaging (MRI) is a powerful platform that enables non-invasive medical imaging with high resolution. MRI enables the diagnosis and assessment of various conditions such as cancer, neurodegenerative and musculoskeletal diseases. However, for MRI to be effective as a diagnostic tool, the measurement protocols must yield consistent results across different MRI systems. Differences in MRI hardware, software platforms and user implementation of imaging protocols produce variability in measurements across different systems or even at different time points for the same system. Such variability can lead to misdiagnosis or inconclusive findings.

Accordingly, there is a need to standardize measurements across various systems. This can be achieved by the use of MRI phantoms, which are objects that act as a surrogate for different body sections or tissue types. Such phantoms will typically contain solutions or materials that are ground truth standards having fixed and known values for various MRI parameters such as T1, T2, T2*, T1rho relaxation times; Proton Density; and Apparent Diffusion Coefficient. The use of such standards enables systems to be characterized and standardized, and facilitates comparisons of images across different machines and time points.

One factor that creates variability across systems and across measurements at different times is temperature. Various MRI parameters such as T1 and T2 relaxation time can be temperature dependent. Apparent Diffusion Coefficient is inherently temperature dependent. Therefore, variations in MRI bore temperatures, which can span from 15° C. to 25° C., will render the use of phantoms as ground truth standards irrelevant if not accurately corrected for temperature.

Temperature measurement in MRI has been achieved using various methods and devices. Currently, digital, alcohol, or fiber optic thermometers are used to assess temperature. These methods are problematic for various reasons. Fiber-optic thermometers are expensive, require laborious set-up and tear down to implement. Other temperature sensors are invasive and require human interface with the phantom before and after the scan, and potentially compromise the MRI phantom integrity by introducing unwanted microorganisms into the phantom.

There has been significant effort over the last few decades to develop a non-invasive Nuclear Magnetic Resonance (NMR) thermometer. A well-known experimental method to determine temperature is to image the chemical shift observed between the NMR signal produced by a hydrogen atom bonded to an oxygen atom (O—H) and a hydrogen atom bonded to a carbon atom (C—H) in a molecule. Typical chemicals used in such a thermometer include, but are not limited to, alcohols and glycols which contain both types of hydrogen atoms. As the temperature changes, the O—H peak resonance frequency shows a pronounced shift, while the C—H peak resonance frequency remains constant. The separation in frequency between these peaks can be directly correlated to an absolute temperature. Such chemical shift thermometers work well in an NMR environment where the main magnetic field is homogeneous, and other spatial dependencies can be ignored since the samples are small. However, for MRI, where the sample sizes and fields of view are large, variations in the magnetic field strength will introduce errors in the chemical shift based thermometer, prohibiting accurate temperature measurement if the thermometer is not reproducibly placed in the exact position, and if variations of the main magnetic field exist between scanners.

Previously, the use of liquid crystals has been proposed for monitoring temperature in an MRI context. Liquid crystals undergo temperature-specific phase changes that can be detected by MRI. In Canadian Patent Number 1,288,812, entitled "Thermometry using phase transitions in encapsulated liquid crystals and magnetic resonance detection methods," by McRae et al., it was proposed to use liquid crystals and their temperature-dependent phase shifts as an indicator of temperature, in the context of in vivo hyperthermia treatment of tumors. Temperatures in the range 42° C. to 45° C. were assessed by NMR spectra of microencapsulated liquid crystals, where temperature-dependent liquid crystal phase transitions, from nematic phase to isotropic phase, were monitored by NMR spectra, wherein a single peak was observed in the spectrum for the nematic phase and a multitude of peaks were observed for the isotropic phase.

The methods disclosed by McRae et al., while useful in the hyperthermic treatment regimen to which they were applied, are insufficient for calibration of phantoms. Few MRI scanners are equipped with the capability to do the spectroscopic analysis needed for McRae's technique, and obtaining MR spectra is a time consuming process that would not integrate well with the process used to characterize or standardize an MRI using a ground truth tissue mimicking standards. Furthermore, the signal obtained using McRae's methods is inadequate for the error assessment needs addressed herein due to the much smaller magnetic field used. Additionally, McRae's implementation required the use of the fluorine 19 to produce measurable signal; such material is expensive and toxic. Additionally, McRae's method requires the liquid crystals to be microencapsulated, making the transition temperature too broad for the accuracy needed for an MRI calibration thermometer Accordingly, there remains a need in the art for novel temperature sensing methods for the facile characterization of MRI systems.

SUMMARY OF THE INVENTION

Disclosed herein are novel implementations of liquid crystal temperature sensing techniques. The novel thermometers and techniques of the invention employ liquid crystals in an innovative way to achieve consistent temperature assessment and the accurate use of standards. The novel liquid crystal thermometers of the invention provide the art with an inexpensive and facile means of accurately measuring temperature when characterizing equipment against ground state standards.

BRIEF DESCRIPTION OF THE DRAWINGS

FIG. 1A is a drawing depicting the cylindrical vessel (101), with top protrusion (102) and bottom receiving indent (103). FIG. 1B is a cutaway view of the vessel, showing the top opening (104) sealed by an inserted hard plastic sphere, such as PMMA (105).

DETAILED DESCRIPTION OF THE INVENTION

The liquid crystal MRI thermometers of the invention comprise a collection of different liquid crystal compositions, wherein each of the liquid crystal compositions has a unique phase transition temperature. A series of liquid crystal compositions having phase transitions spanning the range of typical MRI bore temperatures, e.g. 15-25° C., may be used. The assemblies of the invention are compatible with MRI phantoms and can be included therein. Temperature can be assessed quickly using T1-weighted, T2-weighted, or other scan protocols, wherein phase changes are readily assessed by distinct visual signals.

Figure 2:
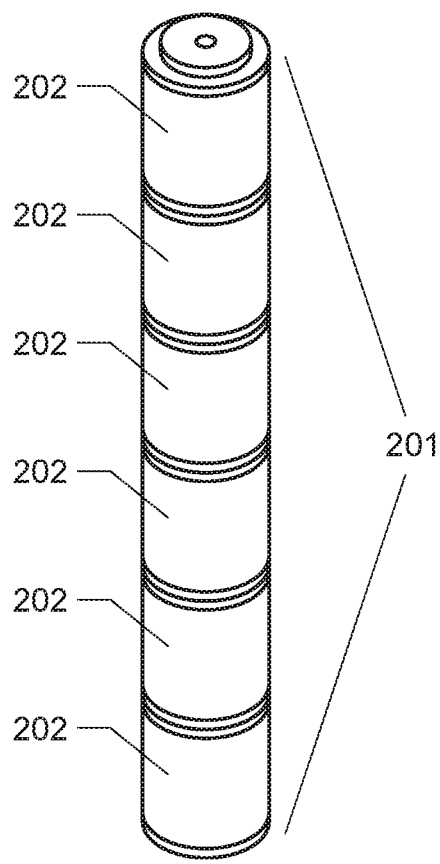
FIG. 2 depicts a thermometer assembly of the invention (201) comprising six individual vessels (202) snapped together end to end.

The concept of the invention is demonstrated by the exemplary embodiment depicted in FIG. 2. FIG. 2 depicts an illustrative implementation of the invention comprising various elements:
- a plurality of containers;
  - wherein each container contains a unique liquid crystal composition having a unique phase transition temperature;
  - wherein the liquid crystal compositions have phase transition temperatures that span the selected range of interest;
  - wherein liquid crystals in the isotropic, liquid phase and in the crystalline, ordered phase yield distinct signals in a selected MRI scan; and
  - wherein the temperature of the MRI phantom can be determined by observing which compositions in the series are in the ordered phase, which are in the transition phase, and which are in the isotropic phase.

Each element of the invention is described in detail next.

Liquid Crystals.

The devices and methods of the invention encompass the use of various liquid crystal compositions. The liquid crystal compositions will be selected and/or formulated such that each has a phase transition temperature at a selected value of interest. The liquid crystals may comprise any thermotropic liquid crystal composition known in the art, wherein an MRI-detectable phase transition occurs within a selected temperature range, for example, in the range of 15-25° C. For example, sterol-based liquid crystals, such as cholesteric liquid crystals may be used.

Exemplary liquid crystals that may be used in the practice of the invention include those described in U.S. Pat. No. 5,422,033, entitled "Phase transition-type liquid crystal composition," by Mochiziki et al.; U.S. Pat. No. 5,508,068, entitled "Cholesteric liquid crystal composition, color-forming liquid crystal composite product, method for protecting liquid crystal and color-forming liquid crystal picture laminated product," by Nakano et al.; and in Brown and Wolken, Liquid Crystals and Biological Systems, Academic Press, NY, 1979.

A phase transition temperature, as known in the art, is a temperature point, or range of temperature values, wherein a volume of liquid crystals will transition between a liquid or isotropic phase and an ordered or crystalline phase such as the nematic, cholesteric, or smectic phase. At temperatures above the phase transition temperature, the composition will switch from an ordered ("crystalline") phase to an isotropic ("liquid") phase due to the kinetic energy/molecular motion of the molecules being too much to support the lower-energy ordered phase.

An MRI-detectable phase transition means a phase transition that is detectable by a selected MRI scanning technique wherein an image is generated and wherein crystals in the liquid or isotropic phase generate a different signal, i.e. imaged differentially, from crystals in the ordered phase (e.g. nematic, cholesteric, or smectic). Liquid molecules in the crystalline state align with magnetic field and proton dipolar interactions cause rapid transitions that cause line broadening and shortening of the T2, and hence do not produce any MR signal. In the isotropic phase, they are fully liquid and contribute to the image signal intensity. Thus, the phase transition is MRI-detectable.

The liquid crystal assemblages of the invention will comprise two or more separately contained aliquots of liquid crystals, wherein each separate aliquot comprises a unique composition having a unique phase transition temperature. The two or more aliquots of liquid crystals will define a temperature range, defined by the lowest transition phase temperature of the two or more liquid crystal compositions and the highest transition phase temperature of the two or more liquid crystal compositions, and encompassing intermediate phase transition temperature values, if any.

In a preferred implementation, the temperature range is a range typically found within the bore of an MRI system, which will typically encompass room temperatures, for example within the range of 15-25° C. It will generally be preferred that the liquid crystal compositions have phase transition temperatures separated at regular intervals, for example 0.1, 0.25, 0.5 or 1.0 degree Celsius increments.

A series of liquid crystal compositions having phase transition temperatures separated by regular intervals can be formulated by mixing two miscible liquid crystal compositions having divergent phase transition temperatures in different proportions to arrive at different intermediate phase transition temperature values. For example, as described in Example 1, two liquid crystal compositions having phase transition temperatures of 11° C. and 42.5° C. were admixed in different proportions to create a series of seven compositions with phase transition temperatures in the range of 17-23° C.

The liquid crystal compositions can be used in the pure or native form, but can also be diluted in an organic solvent to achieve different temperature change characteristics, for example, as described in U.S. Pat. No. 5,508,068.

Containers.

Each aliquot of the two or more liquid crystal compositions will be enclosed in a separate container or a separate compartment of a body comprising multiple containers, separated from each other and from the atmosphere or surrounding liquid, to prevent loss, oxidation, evaporation of solvents, and contamination by microbes. For clarity, enclosure or encasement of liquid crystals, as used herein, refers to containing or enclosing the materials in a macroscale vessel, and does not refer to microencapsulation techniques, such as those utilized in McRae, wherein microscopic aggregates of crystals were coated with biocompatible coatings.

Oxidative attack on unsaturated bonds of the liquid crystals will broaden the temperature range of the phase transition by 0.1° C. to 1° C. or more. To prevent oxidation of the enclosed composition, oxygen in the native liquid crystal chemicals is removed by either vacuum degassing, sonication, and/or passing the chemical stream through a nonmetallic oxygen scavenger such as ascorbic acid, ascorbate salts, or catechol prior to sealing it within a container or compartment.

In the thermometer of the invention, each of the two or more aliquots of liquid crystals are encased in a container. The container which contains each liquid crystal composition must be composed of a material that does not generate substantial MRI signal itself. Exemplary materials that may be utilized include polytetrafluoroethylene, e.g. TEFLON™ or other fluoropolymers; polycarbonate (PC); polypropylene (PP); polyethylene terephthalate (PET); glycol modified polyethylene terephthalate (PETG); polylactic acid (PLA); acrylonitrile butadiene (ABS); high and Low density polyethylene (HDPE/LDPE); polyvinylchloride (PVC); and polyurethane. An especially suitable material is polychlorotriflouroetheylene (aka PCTFE, KEL-F™, and NEOFLON™). As set forth below, this material has particularly low perfusion and can advantageously be welded, which eliminates the need for glued seams or joints, increasing robustness. Flouroethylene based plastics are ideal, but also extremely difficult to glue due to the low surface energy of the material. In addition, the high thermal expansion coefficient of liquid crystals can produce large stresses on glued joints that can cause failure of the glued joints. Chemical compatibility and stability of the glue when in contact with liquid crystals and water simultaneously limits the selection of glues that can be used. For example, an aliphatic amine such as n-Heptane adhesive may be used, for example LOCLITE 770 ™ (Ellesworth Adhesives, Gemantown, Wis., USA).

A critical factor in the design of the container is the liquid crystal aliquot size. An aliquot that is too large will act as a heat reservoir, and the temperature thereof will display hysteresis with the surrounding environment, i.e. it will not respond quickly to changes in the surrounding temperature and therefore cannot act as an accurate thermometer. For example, in some applications, a thermal time constant of 1 minute or less is desirable, to ensure rapid equilibration to the surrounding environment. Conversely, an aliquot that is too small cannot generate sufficient signal to be visualized in an MRI scan. The inventors of the present disclosure have determined that a minimal aliquot size of 65 mm$^3$ liquid crystals and a maximum size of 3,500 mm$^3$ liquid crystals provides a sufficient signal while being sufficiently responsive to bore temperature. For example, aliquots of 120-700 mm$^3$ may be used.

Figure 1A:
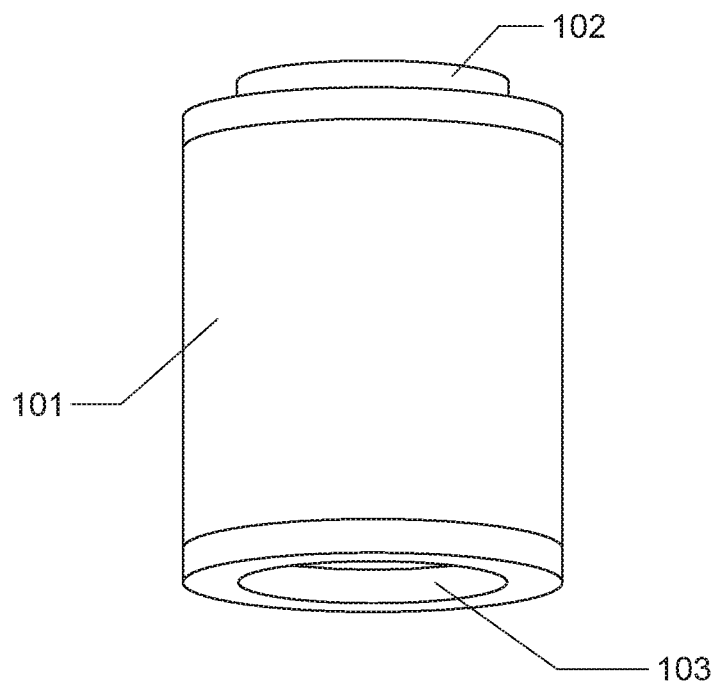
FIGS. 1A and 1B depict vessels of the invention used to encase liquid crystals.

Another critical container factor is the shape or geometry of the container. The shape of the container must be designed for image capture in one or more planes of the MRI system. Generally, the containers of the invention will comprise a volume having a regular shape, such as a cube, cuboid, or cylinder. For example, as depicted in FIG. 1A, the container may comprise a regular cylinder of 7 mm inner diameter, and 8 mm height. The wall thickness of the vessel is an important consideration as well, as an overly thick encasement will slow the equilibration of the liquid crystals with the MRI bore or MRI phantom. For example, a vessel wall thickness of 0.2-0.7 mm, for example, 0.5 mm, may be used.

The volume and container shapes are selected to ensure visualization of a cross section of the liquid crystals in one plane of the MRI system. For example, the volume of material in the vessel should be at least one voxel in width, as determined by the settings and capabilities of the selected system. For example, the volume may comprise at least two, three, or four voxel widths. For example, in one implementation, it would be desirable to capture at least four voxels of the liquid crystal to ensure visualization of at least two identical adjacent voxels of the liquid crystals. If the volume of the liquid crystals is too small, i.e. sufficient voxels comprising primarily the liquid crystal material are not imaged, the material will be undersampled. Worse, if there are not sufficient voxels comprising primarily the liquid crystal material, it is possible the signal would be averaged with the wall of the vessel or even worse the neighboring liquid crystal. This would result in signal averaging across liquid crystal vessel units, greatly increasing the uncertainty on the temperature measurement.

Thermometer Assembly.

In a preferred implementation, the thermometer of the invention will comprise an assembly comprising multiple containers arranged in a linear or flat configuration, enabling imaging of the containers of the assembly in a single plane. The multiple containers will comprise aliquots of liquid crystals from the aforementioned series of liquid crystal solutions, for example 2, 3, 4, 5, 6, 7, 8, or more containers having liquid crystals with phase transition temperatures at regular increments, e.g. 0.1, 0.25, 0.5, or 1.0 degrees.

In one implementation of the invention, each container comprises a pair of complementary interlocking elements that enable different containers to be snapped together in a linear configuration or other configuration. Such complementary elements may comprise, for example, tongue and groove elements, rib and debossed groove elements, or other complementary structures that interlock, or which can serve as attachment sites joined by adhesives or welding of the container material. The thermometer may comprise an assembly of interlocked or connected containers. For example, interlocking elements are depicted in FIG. 1A and an assembly comprising multiple interlocked or connected containers is depicted in FIG. 2. Alternatively, the thermometer may comprise a housing or other body wherein multiple containers are held in place or otherwise contained in the housing or body. The thermometer assembly may comprise a linear configuration or any other configuration that allows for separate imaging of the multiple containers in the same plane.

Thermometer assemblies can be designed for compatibility with MRI phantom components.

Novel Container Design.

Figure 1B:
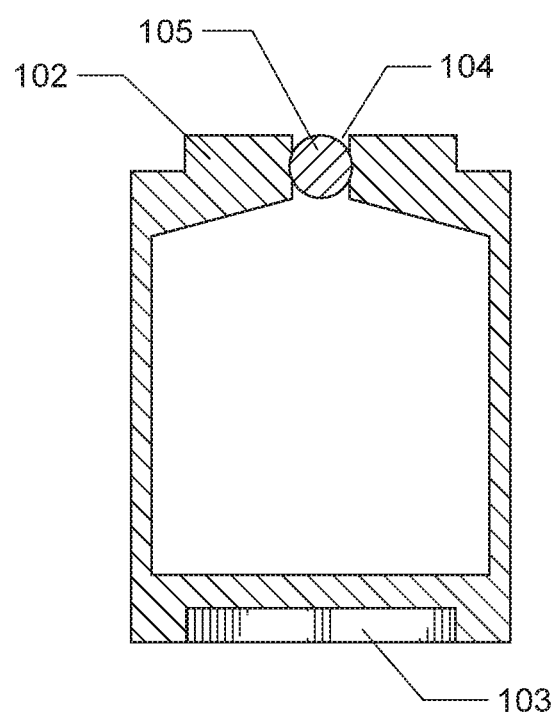

The unique requirements of the present invention led to the development of a novel container design which includes many features that facilitate successful operation of the thermometer. As depicted in FIG. 1A, the novel container of the invention comprises a cylindrical body which can be filled with a liquid crystal solution. In one embodiment, the container of the invention comprises polychlorotriflouroetheylene. This fluoropolymer is chemically inert and has among the lowest permeability of water and other compounds. Generally, chemically inert plastics are difficult to glue, however PCTFE is somewhat unique as a fluoropolymer in that it can be welded, enabling construction of a vessel without glue joints that might interfere with MRI signals due to the chemical makeup of adhesives. The container of the invention comprises two pieces of PCTFE welded together to form a vessel having an opening, for example, a circular opening. The opening may comprise a proximal narrow section, an intermediate wider section, and distal narrow section. This opening enables the vessel to be filled to the top without any airspace, and it can then be sealed by forcing a hard plastic or glass sphere or bead into the opening, wherein the diameter of the sphere is slightly larger than that of the intermediate section of the opening. A cross sectional diagram depicting an exemplary vessel and sealing sphere of the invention is depicted in FIG. 1B.

The material of the container will comprise a material with sufficient flexibility or give to enable the sphere, under pressure to pass through the narrow section without cracking or breaking the material and become lodged and held in place in the intermediate wider space, creating an airtight and liquid-proof seal, and to accommodate the pressure forces exerted by the liquid when the sphere is forced into the locked position. For example, an opening of sufficient width to inject the liquid crystals by syringe may be used, for example, to accommodate a 19 gauge needle may be used, for example, a diameter of 1 mm.

Phantoms.

The thermometers of the invention may be placed within an MRI calibration phantom, as known in the art, in order to enable accurate characterization of the MRI system. The phantom may comprise a body, wherein the body contains an MRI thermometer of the invention and also contains one or more containers containing ground state standard materials. In an alternative embodiment, the MRI thermometer is immersed in a ground state material within the phantom.

Temperature Measurement.

The scope of the invention encompasses the afore-described thermometers. The scope of the invention further encompasses methods of using such thermometers to assess MRI bore and/or MRI phantom temperature. The general method encompasses the steps of:

acquiring an image of an MRI thermometer of the invention by a selected MRI scan technique;

wherein the thermometer is in the MRI bore;

by the acquired image, assessing the break point between a first liquid crystal composition being that with the lowest phase transition temperature which is in the liquid state and a second liquid crystal composition, being that with the highest phase transition temperature that is in the solid state;

wherein the MRI bore temperature is determined as a being in a range intermediate between the phase transition temperatures of first and second liquid crystal compositions.

In the broadest implementation, the method encompasses performance of an MRI scan wherein the thermometer is imaged using MRI methodologies that result in differential signal of the liquid crystal aliquots when the liquid crystals are in an isotropic phase vs. an ordered phase. For example, the scan may result in an image wherein ordered crystals are dark (no or little signal) and isotropic, liquid crystals are imaged as bright (strong signal). In some implementations, an intermediate phase may also be detectable, the intermediate phase being indicative of a temperature at or near the phase transition temperature of the liquid crystals, for example, showing as gray.

Temperature is assessed by determining the break point within a series of liquid crystal temperature standards, i.e. identifying a first liquid crystal composition in the series having the lowest phase transition temperature which is in the liquid state and a second liquid crystal composition in the series having the highest phase transition temperature which is in the solid state. Bore and/or phantom temperature can be determined as a value or range intermediate between the phase transition temperatures of the first and second compositions. Alternatively, identification of the liquid crystal aliquot having an intermediate phase (gray) can be used to determine the temperature value or range. For example, in a liquid crystal thermometer having aliquots with phase transition temperatures at 1° C. increments between 17° C. and 23° C., if the aliquot having a phase transitions temperature of 19° C. is observed to be in the crystalline, ordered phase (e.g. dark in the scan) and the aliquot having a phase transitions temperature of 20° C. is observed to be in the liquid, isotropic phase (e.g. bright in the scan), the bore temperature is assessed as being within the range of 19-20° C.

Figure 3:
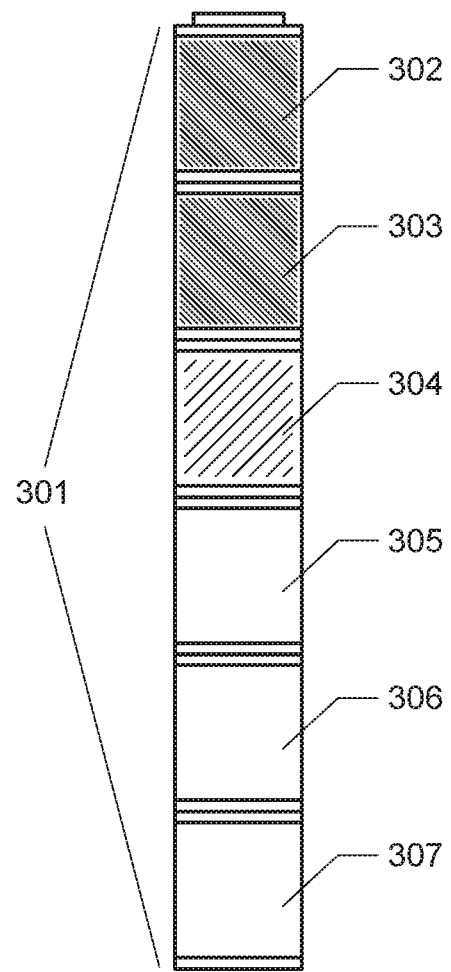
FIG. 3 represents a thermometer assembly of the invention which has been read by an appropriate MRI scan to determine whether liquid crystals are in the ordered or liquid phase.

A drawing depiction of a scan of the thermometer assembly of the invention is presented in FIG. 3. The thermometer is an assembly (301) comprising multiple vessels (302, 303, 304, 305, 306, and 307), wherein each vessel contains a liquid crystal composition with a unique phase transition temperature, ordered from lowest phase transition temperature (302) to highest (307). At the time of the scan, the temperature was intermediate between the phase transition temperature of vessel 303 and that of 305. As the temperature at the time of the scan was higher than the phase transition temperature of the liquid crystals in vessels 305, 306, and 307, these liquid crystals were in an isotropic state, yielding a bright signal. The temperature at the time of the scan was lower than the phase transition temperature of the liquid crystals in vessels 302 and 303, and these liquid crystals were in an ordered state, yielding a dark signal. The temperature at the time of the scan was at about the phase transition temperature of the liquid crystals in vessel 304, with these liquid crystals were in a mixed state with some ordered and some isotropic, yielding a gray signal.

The scan may comprise any MRI imaging technique capable of producing differential signals by liquid crystals in the ordered and liquid states (and intermediate states, in some embodiments). Exemplary scans include spin echo (SE), gradient echo (GRE) and spoiled gradient echo (SPGR). Preferably, the scan will be short, for example, being on the order of 0.25-2.0 minutes, for example, 1 minute or less. This insures that a snapshot of current temperature can be captured in the event of changing bore and/or phantom temperatures and that the temperature data acquisition does not significantly add to the duration of the scan time, and subsequently the quality control process used to evaluate and report the characteristics of the MRI machine.

Exemplary scans include:

gradient echo, for example with parameters of: flip angle 70°, TR 200 ms, TE 5.00 ms, voxel size 0.55 $mm^2$ by 3 mm slice thickness, acquisition time 51.2 s;

spin-echo, for example with parameters of: flip angle 90°, TR 20.10 ms, TE 13.82 ms, voxel size 0.55 $mm^2$ by 3 mm slice thickness, acquisition time 41.2 s;

spoiled gradient echo (SPGR), for example with parameters of: flip angle 20°, TR 60.48 ms, TE 5.00 ms, voxel size 1.17 $mm^2$ by 3 mm slice thickness, acquisition time 1.9 s; and spoiled gradient echo, for example with parameters of: flip angle 70°, TR 200 ms, TE 2.47 ms, voxel size 0.625 $mm^2$ by 3 mm slice thickness, acquisition time less than sixty seconds.

The exemplary parameters presented above may be varied by one of skill in the art to attain suitable measurements that distinguish ordered and liquid crystal states for the selected liquid crystal compositions used in a particular thermometer. For example, the enumerated parameters of flip angle, repetition time (TR), echo time (TE), voxel size, and acquisition time listed above may be varied by up to 5%, up to 10%, or up to 25% in alternative implementations.

In one embodiment, the resulting scan is analyzed by visual inspection of the image, wherein the break point in the series of liquid crystal solutions is noted by an observer to determine temperature. In another embodiment, the scan is analyzed by automated means, wherein an analysis algorithm or other technique is used to determine the break point between liquid and ordered crystals states in the series of liquid crystal solutions forming the thermometer. Such automated analysis techniques for determining light, dark, and/or gray can be readily implemented by one of skill in the art, for example, using computer aided detection algorithms.

When analyzing a phantom or other target comprising ground state standard for purposes of characterizing an MRI system, a single temperature scan may be performed or multiple temperature scans may be performed. For example, a temperature scan at the beginning of phantom assessment and at the end of phantom assessment may be performed and the average temperature of the two scans may be used to designate temperature of the ground state standards. Alternatively, the data acquired at an earlier timepoint would use the first temperature assessment and the data acquired at a timepoint closer to the end of the scan would use the last temperature assessment. Ideally, the temperature would be measured at several time intervals to provide an adequate assessment of the temperature change over time.

In a related embodiment, the scope of the invention comprises a method of characterizing an MRI system, comprising the steps of:
  determining MRI bore temperature or the temperature of ground state standards by means of a liquid crystal thermometer of the invention;
  measuring one or more temperature-dependent properties of the ground state standard; and
  correcting or adjusting the measure of the one or more temperature-dependent properties of the ground state standard based on the temperature measured by the liquid crystal thermometer of the invention.

By this method, a correction factor can be applied to MRI assessments of ground state standards based on the known relationship between ground state standard properties and temperature.

EXAMPLES

Example 1. Formulation of a Liquid Crystal Series

A series of seven cholesteric (sterol based) liquid crystal formulations exhibiting a cholesteric to isotropic transition between 17° C. and 23° C. was formulated by mixing different proportions of two liquid crystal compositions. The liquid crystal compositions were product number GB310 (LCR Hallcrest, Glenview Ill., USA), having a phase transition temperature of 11° C. and GB320 (LCR Hallcrest, Glenview Ill., USA), having a phase transition temperature of 42.5° C. Table 1 lists the proportion of the two solutions in each mixture.

| Transition Temperature | % 11.5° C. LC | % 42.5° C. LC |
| --- | --- | --- |
| 17° C.° | 83.6 | 16.4 |
| 18° C. | 80.6 | 19.4 |
| 19° C. | 77.6 | 22.4 |
| 20° C. | 74.6 | 25.4 |
| 21° C. | 71.6 | 28.4 |
| 22° C. | 68.7 | 31.3 |
| 23° C. | 65.7 | 34.3 |

Example 2. Liquid Crystal Thermometer

A liquid crystal thermometer was constructed using multiple interlocking containers. Containers as depicted in FIG. 1A were constructed from PCTFE. Each container was filled with a different solution of liquid crystal compositions of the series of Example 1, by syringe, and was sealed by plugging the opening with hard plastic ball. The opening diameter was 0.035 inches+1-0.001 inches, and the sphere had a diameter of 0.0394 inches+/−0.002 inches. The interlocking containers were snapped together in order of increasing phase transition temperature. The resulting assembly is depicted in FIG. 2.

Example 3. Temperature Measurements

The liquid crystal thermometer of Example 2 was placed in a Diffusion Standard (model number 128, QalibreMD (High Precision Devices), Boulder Colo., USA). The phantom was imaged on a 3 T clinical system (Siemens Prisma$^{fit}$) before and after routine measurements of ground state standards, with a scan duration of one hour. Using a 2D FLASH sequence, the temperature at initial scan was 19-19.7° C. and at the end of scanning the temperature had warmed to the 19.7-19.9° C., as determined by the light and dark break point between liquid crystal aliquots. (A FLASH sequence is a fast low angle shot sequence, also known as a spoiled gradient-echo sequence using a flip angle of less than 90 degrees.) A digital thermometer measured the temperature prior to scanning at 18.6±0.2° C., and post-scanning at 19.6±0.2° C. Differences between the initial temperature as measured by the digital thermometer and the liquid crystal thermometer are due to the 10 minute time difference between when the phantom temperature was measured with the digital thermometer and the first temperature scan was taken.

Additional scans of the thermometer were performed in both pre-clinical (Agilent) and clinical (Siemens) systems at 3 T using various scan parameters:
  Pre-clinical gradient echo: flip angle 70°, TR 200 ms, TE 5.00 ms, 0.55 mm$^2$ acquisition time 51.2 s;
  Pre-clinical spin-echo: flip angle 90°, TR 20.10 ms, TE 13.82 ms, 0.55 mm$^2$ acquisition time 41.2 s;
  Pre-clinical spoiled gradient echo (SPGR): flip angle 20°, TR 60.48 ms, TE 5.00 ms, 1.17 mm$^2$ acquisition time 1.9 s; and
  Clinical spoiled gradient echo: flip angle 70°, TR 200 ms, TE 2.47 ms, 0.625 mm$^2$.

In each of the scans, the break point between liquid crystal aliquots was readily ascertained, both by manual visual examination of the scans and by computer aided detection algorithms, and measured temperatures were within 0.5° C. of bore temperatures measured by digital thermometer.

All patents, patent applications, and publications cited in this specification are herein incorporated by reference to the same extent as if each independent patent application, or publication was specifically and individually indicated to be incorporated by reference. The disclosed embodiments are presented for purposes of illustration and not limitation. While the invention has been described with reference to the described embodiments thereof, it will be appreciated by those of skill in the art that modifications can be made to the structure and elements of the invention without departing from the spirit and scope of the invention as a whole.

What is claimed is:

1. A thermometer for monitoring bore temperature of an MRI system, comprising two or more liquid crystal compositions, wherein each of the two or more liquid crystal compositions is enclosed in a separate container and wherein each composition has a phase transition temperature between an ordered state and a liquid state, and wherein the ordered state and liquid state of the liquid crystal compositions produce distinct signals when imaged by a selected MRI scan technique.

2. The thermometer of claim 1, wherein the two or more liquid crystal compositions comprise cholesteric liquid crystals.

3. The thermometer of claim 1, wherein the two or more liquid crystal compositions have phase transition temperatures between 15 and 25° C.

4. The thermometer of claim 1, wherein the two or more liquid crystal compositions have phase transition temperatures that vary by a fixed increment.

5. The thermometer of claim 4, wherein the increment is 0.1, 0.5, or 1.0° C.

6. The thermometer of claim 1, wherein each container comprises a material that does not generate a substantial signal when imaged by the selected MRI scan technique.

7. The thermometer of claim 6, wherein the material is selected from the group consisting of polychlorotriflouroetheylene; polytetrafluoroethylene; a fluoropolymer; polycarbonate; polypropylene; polyethylene terephthalate; glycol modified polyethylene terephthalate; polylactic acid; acrylonitrile butadiene; high density polyethylene, low density polyethylene; polyvinylchloride; and polyurethane.

8. The thermometer of claim 7, wherein the container comprises an opening sealed by a sphere.

9. The thermometer of claim 1, wherein the selected scan technique is selected from the group consisting of a spin echo, gradient echo and spoiled gradient echo scans.

10. The thermometer of claim 1, wherein the containers containing the two or more liquid crystal compositions comprise complementary interlocking features and wherein the containers are configured in an assembly of interlocked containers.

11. A method of assessing temperature of an Mill bore, comprising
acquiring an image of a thermometer by a selected Mill scan technique;
wherein the thermometer is in the MRI bore;
wherein the thermometer comprises two or more liquid crystal compositions, wherein each of the two or more liquid crystal compositions is enclosed in a separate container and wherein each composition has a phase transition temperature between an ordered state and a liquid state, and wherein the ordered state and liquid state of the liquid crystal compositions produce distinct signals when imaged by the selected MM scan technique;
by the acquired image, assessing the break point between a first liquid crystal composition being that with the lowest phase transition temperature which is in the liquid state and a second liquid crystal composition, being that with the highest phase transition temperature that is in the solid state;
wherein the Mill bore temperature is determined as a being in a range intermediate between the phase transition temperatures of first and second liquid crystal compositions.

12. The method of claim 11, wherein the liquid crystal compositions comprise cholesteric liquid crystals.

13. The method of claim 11, wherein the two or more liquid crystal compositions have phase transition temperatures between 15 and 25° C.

14. The method of claim 11, wherein each container comprises a material selected from the group consisting of polychlorotriflouroetheylene; polytetrafluoroethylene; a fluoropolymer; polycarbonate; polypropylene; polyethylene terephthalate; glycol modified polyethylene terephthalate; polylactic acid; acrylonitrile butadiene; high density polyethylene, low density polyethylene; polyvinylchloride; and polyurethane.

15. The method of claim 11, wherein the containers containing the two or more liquid crystal compositions comprise complementary interlocking features and wherein the containers are configured in an assembly of interlocked containers.

16. The method of claim 11, wherein the selected scan technique is selected from the group consisting of a spin echo, gradient echo and spoiled gradient echo scans.

17. The method of claim 11, wherein the break point is assessed by an automated analysis.

\* \* \* \* \*